(12) United States Patent
Van Houdt

(10) Patent No.: US 9,847,109 B2
(45) Date of Patent: Dec. 19, 2017

(54) MEMORY CELL

(71) Applicant: IMEC VZW, Leuven (BE)

(72) Inventor: Jan Van Houdt, Bekkevoort (BE)

(73) Assignee: IMEC VZW, Leuven (BE)

(*) Notice: Subject to any disclaimer, the term of this patent is extended or adjusted under 35 U.S.C. 154(b) by 0 days.

(21) Appl. No.: 15/369,204

(22) Filed: Dec. 5, 2016

(65) Prior Publication Data

US 2017/0178698 A1    Jun. 22, 2017

(30) Foreign Application Priority Data

Dec. 21, 2015 (EP) .................................... 15201495

(51) Int. Cl.
| | | |
|---|---|---|
| *G11C 16/04* | (2006.01) | |
| *G11C 7/06* | (2006.01) | |
| *H01L 29/51* | (2006.01) | |
| *H01L 29/78* | (2006.01) | |
| *H01L 29/788* | (2006.01) | |
| *H01L 29/792* | (2006.01) | |

(52) U.S. Cl.
CPC .............. *G11C 7/06* (2013.01); *G11C 16/045* (2013.01); *G11C 16/0441* (2013.01); *H01L 29/516* (2013.01); *H01L 29/78* (2013.01); *H01L 29/788* (2013.01); *H01L 29/792* (2013.01)

(58) Field of Classification Search
CPC .................................................... G11C 16/045
USPC ..................................................... 365/185.01
See application file for complete search history.

(56) References Cited

U.S. PATENT DOCUMENTS

| | | | | |
|---|---|---|---|---|
| 5,648,930 A * | 7/1997 | Randazzo | .............. | G11C 14/00 365/154 |
| 5,812,450 A * | 9/1998 | Sansbury | ........... | G11C 16/0441 365/104 |
| 6,002,610 A * | 12/1999 | Cong | .................. | G11C 16/0441 365/185.05 |
| 6,169,307 B1 * | 1/2001 | Takahashi | .......... | G11C 16/0416 257/315 |
| 7,212,438 B2 * | 5/2007 | Gratz | ................... | G11C 16/045 365/185.05 |
| 7,301,821 B1 * | 11/2007 | Greene | .............. | G11C 16/0433 365/185.01 |
| 7,339,820 B2 * | 3/2008 | Kato | .................. | G11C 16/0441 257/E21.682 |
| 7,952,932 B2 * | 5/2011 | Van Duuren | ...... | G11C 16/0475 365/185.05 |

* cited by examiner

*Primary Examiner* — Son Mai
(74) *Attorney, Agent, or Firm* — McDonnell Boehnen Hulbert & Berghoff LLP

(57) ABSTRACT

The present disclosure relates to a memory cell, a memory array, and methods for writing a memory cell. In an example embodiment, a memory cell comprises a first transistor, a second transistor, and a differential sense amplifier. The first transistor is a Vt-modifiable n-channel transistor and the second transistor is a Vt-modifiable p-channel transistor, each transistor having first and second main electrodes. The first main electrodes of the first and second transistors are connected together. The differential sense amplifier is connected to the second main electrodes of the first and the second transistor. The differential sense amplifier is adapted for sensing the current difference between the first transistor and the second transistor.

20 Claims, 7 Drawing Sheets

| Operating table | WL | BL | SLA | SLB |
|---|---|---|---|---|
| Page erase | -2Vcc | 0 | 0 | 0 |
| Write select/ deselect | 2Vcc | 0/ (2)Vcc | open | open |
| Read | Vcc/2 | Vcc | SA | SA |

| Operating table | WL | BL | PL | SLA/SLB |
|---|---|---|---|---|
| Page erase | Vcc | 0 | -2Vcc | 0 |
| Write/ deselect | Vcc | 0/ Vcc | 2Vcc | open |
| Read | Vcc | Vcc | 0 | SA |

Fig. 10

| Operating table | WLA | WLB | BL | SLA/SLB |
|---|---|---|---|---|
| Page erase | -2Vcc | -2Vcc | 0 | 0 |
| Write/ deselect | 2Vcc | 2Vcc | 0/ Vcc | open |
| Read/ deselect | Vcc/2 -Vcc | Vcc/2 Vcc | Vcc | SA |

Fig. 11

MEMORY CELL

CROSS-REFERENCE TO RELATED APPLICATIONS

The present application is a non-provisional patent application claiming priority to European Patent Application No. EP 15201495.7, filed Dec. 21, 2015, the contents of which are hereby incorporated by reference.

FIELD OF THE DISCLOSURE

The present disclosure relates to the field of memory cells. More specifically it relates to memory cells which could be used as a replacement for traditional SRAM cells

BACKGROUND

Static RAM (Static Random Access Memory) is ubiquitous in current integrated circuits as the work horse for on-chip cache memory. However, SRAM cells are large and do not scale well (cell size becomes increasingly larger in terms of $F^2$ and the static leakage increases). Especially at higher caching levels (L3 and L4), the area penalty is substantial.

SRAM cells typically comprise 6 transistors. This has its consequences for the size of an SRAM cell and for the power consumption of the SRAM cell. In the case of 2D planar design the size of an SRAM cell with 6 transistors typically is larger than 150 $F^2$, wherein F is the smallest linewidth. This size increases with scaling.

Therefore, there is a strong motivation to investigate other memory cell concepts. Some conventional memory cells, however, have an access speed which is much smaller than SRAM. Examples thereof are NOR, 1T1R, 1T1C.

Alternatives are searched to decrease the area and power consumption of the SRAM. A possible alternative is spin-transfer-torque magnetoresistive random access memory (STT-MRAM). There are, however, still different issues to be solved for STT-MRAM (e.g. processing issues). STT-MRAM could be a possible replacement candidate for SRAM, but only on the long term.

There is therefore still room for alternatives for SRAM which have a smaller area per cell than SRAM.

SUMMARY

It is an object of embodiments of the present disclosure to provide memory cells with a reduced area compared to 6 T-SRAM and with a higher access speed than NOR, 1T1R, or 1T1C memory cells.

The above characteristics may be provided by a device and method according to embodiments of the present disclosure.

In a first aspect, the present disclosure provides a memory cell comprising a first transistor, a second transistor and a differential sense amplifier. The first transistor is a Vt-modifiable n-channel transistor having a first and a second main electrode and the second transistor is a Vt-modifiable p-channel transistor having a first and a second main electrode, the first main electrodes of the first and second transistors being connected together, and the differential sense amplifier being connected to the second main electrodes of the first and the second transistor. The differential sense amplifier is adapted for sensing the current difference between the first transistor and the second transistor.

A memory cell according to embodiments of the present disclosure may be for use in a memory array. Such a memory array may include an array of memory cells logically organized in rows and columns. The memory cells on a same column may share a single sense amplifier.

In some embodiments of the present disclosure, a speed comparable to SRAM can be obtained with fewer transistors than in SRAM, where typically 6 transistors are used. In some embodiments of the present disclosure, storing a bit by changing the threshold voltage Vt results in a direct change of the current in the channel below. This results in a compact way to store information.

In some embodiments of the present disclosure, a higher speed can be obtained than in single ended memory cells. This speed increase is the result of using an n-channel and p-channel transistor in parallel, which results in complementary signals, and of sensing the current difference using a differential sense amplifier.

In some embodiments of the present disclosure, the use of only two transistors is sufficient to obtain a complementary signal. Some benefits of a complementary signal may include:

(1) The zero reference current $I_{ref}$ opens the read window. In a single ended cell either a current is flowing or no current is flowing. For the single ended cell to turn on, the current needs to increase from zero to a predetermined current level. For a complementary cell the current comes either from the p-channel transistor (the second transistor) or from the n-channel transistor (the first transistor). Therefore, in some embodiments of the present disclosure, a reference current level 0 can be used compared to a single ended cell where the reference level is between zero and the current level of the transistor when it is turned on.

(2) To increase the read window of a single ended transistor, one would typically increase the width of the transistor. However, this has some drawbacks. For example, when doubling the width of a single ended transistor, the turn-on current changes to twice $I_{read}$ compared to $+/-I_{read}$ for the complementary cell according to embodiments of the present disclosure. However, when doubling the width of the single ended transistor, the capacitance, seen by the sense amplifier, also increases. In some cases, increasing the width of the single ended transistor causes the current to increase, as well as the capacitance. As a result, the operation of the memory cell is slowed down. In some embodiments of the present disclosure, the memory cell only requires current on one branch (the n-channel or the p-channel). Therefore the differential sense amplifier only sees the capacitance of the ON transistor.

(3) A symmetrical cell (as is the case in embodiments of the present disclosure) permits bit line twisting resulting in common mode rejection. This bit line twisting is not possible in a single ended transistor as it is asymmetrical (it only has one bit line).

In some embodiments of the present disclosure, the memory cell can be implemented at a low cost. In a case where 2 Vcc is sufficient for writing, a boot strap circuit is sufficient for generating this 2 Vcc. Also the I/O transistors of the CMOS chip may be used for writing and erasing, hence no additional processing cost is attached to this 'high' voltage.

In some embodiments of the present disclosure, existing processes can be reused. Therefore producing memory cells according to the present disclosure may be inexpensive.

In embodiments of the present disclosure the first transistor and the second transistor are direct tunneling devices.

In embodiments of the present disclosure the first transistor and the second transistor are floating gate transistors.

In embodiments of the present disclosure, the gate stack of the first transistor and the second transistor comprises a first oxide layer, a second metal and/or doped polycrystalline layer, an $HfO_2$ layer, and a metal gate.

In some embodiments of the present disclosure, the stack is compatible with CMOS.

In embodiments of the present disclosure, the first transistor and the second transistor are charge trap devices.

In some embodiments of the present disclosure, the required gate voltage can be decreased by using a charge trap transistor instead of a floating gate transistor.

In embodiments of the present disclosure, the gate stack of the first transistor and the second transistor comprises a first oxide layer, a second nitride layer, a $HfO_2$ layer, and a metal gate.

In embodiments of the present disclosure, the first transistor and the second transistor are ferroelectric field effect transistors.

In some embodiments of the present disclosure, the trade-off between retention and lower write voltage is avoided. No measures are needed for removing the depolarization field.

In embodiments of the present disclosure, the gate stack of the first transistor and the second transistor comprises a first ferroelectric layer made of doped $HfO_2$, optionally a second $HfO_2$ layer, and a metal gate.

In some embodiments of the present disclosure, the ferroelectric phase can be made of $HfO_2$. This allows for the use of the same gate dielectric material as for CMOS except for the fact that it is doped.

In embodiments of the present disclosure the transistors have a control electrode, wherein the control electrode of the first transistor is connected to the control electrode of the second transistor.

In some embodiments of the present disclosure, the control electrodes of transistors of a single memory cell may be driven by a single word line. For example, when writing a cell, a positive voltage is applied to the control electrode of the first transistor and to the control electrode of the second transistor, such that the threshold voltage of both transistors increases. In the case of ferroelectric field effect transistors an increasing threshold voltage Vt causes the n-channel transistor to switch on and causes the p-channel transistor to switch off. In the case of charge trap devices and in the case of floating gate transistors an increasing threshold voltage Vt causes the n-channel transistor to switch off and causes the p-channel transistor to switch on. As such, in embodiments of the present disclosure, only one word line is needed to drive both at the same time, a very compact design of 2 cells with only 4 terminals is possible.

In embodiments of the present disclosure the memory cell comprises a third transistor wherein a main electrode of the third transistor is connected to the first main electrodes of the first and second transistor.

In some embodiments of the present disclosure, a cell can be selected before reading it. Thus read disturb problems are avoided.

A second aspect of the present disclosure provides a memory array, the array comprising memory cells according to embodiments of the first aspect of the present disclosure, wherein the memory array is used as cache memory.

In some embodiments of the present disclosure, the cache memory area can be reduced compared to cache memories using other 6 T SRAM cells.

In a third aspect the present disclosure provides a method for writing a memory cell, the method comprising, in a first step erasing the memory cell by applying a same erase voltage to a control electrode of the first transistor as to a control electrode of the second transistor, and in a second step writing the memory cell by applying a same write voltage to the control electrode of the first transistor as to the control electrode of the second transistor.

In some embodiments of the present disclosure, the control electrodes of the first transistor and the second transistor can be simultaneously driven when erasing and when writing.

In embodiments of the present disclosure the write voltage is twice the supply voltage or lower.

In embodiments of the present disclosure a refresh scheme is implemented to overcome the trade-off between voltage and retention.

Particular aspects of embodiments of the present disclosure are set out in the accompanying independent and dependent claims. Features from the dependent claims may be combined with features of the independent claims and with features of other dependent claims as appropriate and not merely as explicitly set out in the claims.

These and other aspects of the present disclosure will be apparent from and elucidated with reference to the embodiment(s) described hereinafter.

BRIEF DESCRIPTION OF THE FIGURES

FIG. 10 shows an operating table for operating a 3 T-memory cell as in FIG. 7, in accordance with embodiments of the present disclosure.

FIG. 11 shows an operating table for operating a 2 T-memory cell as in FIG. 8, in accordance with embodiments of the present disclosure.

Figure 1:
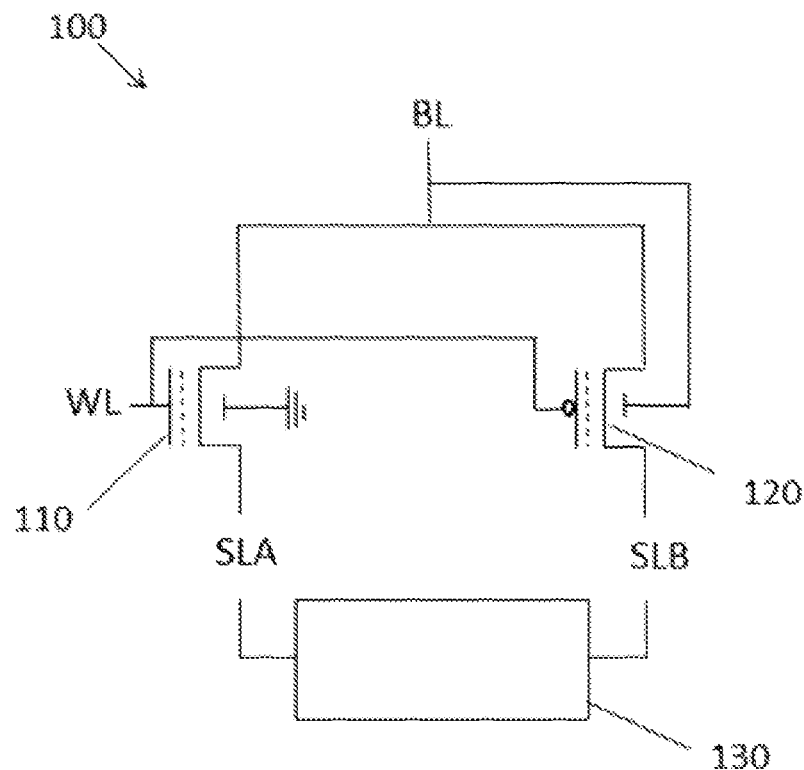
FIG. 1 shows a circuit diagram of a 2 T memory cell in accordance with embodiments of the present disclosure.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION

Features of the present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the present disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the present disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the present disclosure may be practiced without these specific details. In other instances, methods, structures and techniques have not been shown in detail in order not to obscure an understanding of this description.

Where in embodiments of the present disclosure reference is made to Vt modifiable transistors, reference is made to transistors for which the threshold voltage can be modified electrically.

In a first aspect, embodiments of the present disclosure relate to a memory cell 100 as illustrated in FIG. 1. More specifically, in embodiments of the present disclosure the circuit concept of the memory cell is envisaged. Memory cells 100 according to embodiments of the present disclosure comprise a first transistor 110, a second transistor 120, and a differential sense amplifier 130. The first transistor is a Vt-modifiable n-channel transistor and the second transistor is a Vt-modifiable p-channel transistor. The transistors are three-terminal devices, comprising a first main electrode and a second main electrode, such as a source and a drain, and a control electrode, such as a gate, for controlling the flow of electrical charges between the first main electrode and the second main electrode.

The differential sense amplifier 130 is adapted for sensing the current difference between the first transistor 110 and the second transistor 120.

The first main electrode of the first transistor 110 is connected to the first main electrode of the second transistor 120, and both are connected to a bitline BL. The differential sense amplifier 130 is connected to the second main electrode of the first transistor 110 and to the second main electrode of the second transistor 120. The control electrodes of the first and the second transistors 110, 120 are connected to a wordline WL.

By taking two complementary Vt modifiable transistors 110, 120 (n-channel and p-channel) and putting them in parallel and by sensing the difference in current between both transistors, a differential memory cell can be obtained. In other words, single ended cells are made complementary by putting them in a circuit configuration in accordance with embodiments of the present disclosure.

In embodiments of the present disclosure Vt-modifiable transistors are used. These are transistors which may be programmed by shifting the threshold voltage Vt. Examples thereof are direct tunneling devices such as thin oxide floating gate (FG) cells, and charge trapping (CT) cells. Vt-modifiable transistors may also be ferroelectric FETs (FE). For the direct tunneling devices programming is done by bringing a charge between the control electrode, further called the gate, and the channel.

The gate stack of a floating gate cell comprises a gate stack comprising a tunneling isolator, a floating gate, a control dielectric, and a control gate. The floating gate may for example be a metal gate or a doped polycrystalline silicon gate.

Charge trap devices have a charge trapping layer, such as for instance a nitride layer, instead of a floating gate.

In embodiments of the present disclosure the Vt-modifiable transistors are ferroelectric field effect transistors. Instead of a charge between the gate and the channel, a ferroelectricum is used. A ferroelectricum does not store any charge; however, it can be polarized. The polarization charge between the gate and the channel also introduces a change in threshold Vt.

The present disclosure is technology independent. Memory cells according to embodiments of the present disclosure can be implemented in different types of technology such as for instance planar technology, finFET technology, or Silicon on Insulator.

Figure 2:
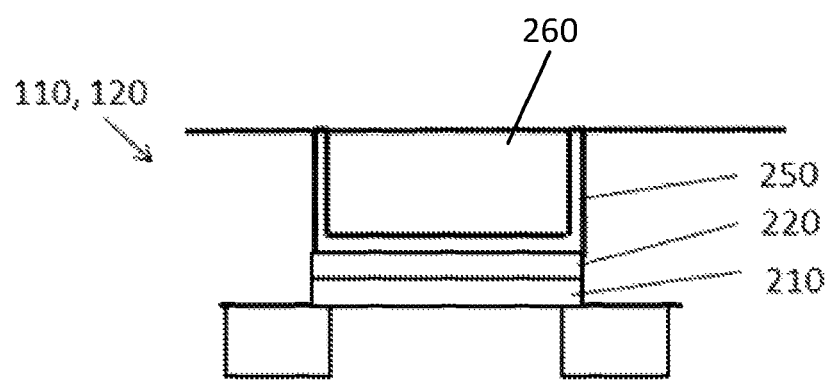
FIG. 2 shows the gate stack of a charge trapping transistor or of a floating gate transistor as may be used in embodiments of the present disclosure.

FIG. 2 shows a gate stack of a transistor 110, 120 (direct tunneling device) which may be used in a memory cell 100 in accordance with embodiments of the present disclosure. In the example the gate stack comprises a first layer (the layer closest to the channel) which is a tunnel dielectric layer 210, e.g. a tunnel oxide layer. This layer may for example be a SiON layer, an HfSiON layer or a $SiO_2$ layer. The thickness of this layer may be below 2 nm to reduce the gate voltage for writing; the tunnel dielectric layer thickness may for example be between 1 and 1.5 nm.

On top of the tunnel dielectric layer 210 is a very thin second layer 220, which may be a floating gate or a charge trapping layer. In embodiments of the present disclosure, for example in the case of a charge trap layer, the thickness of this second layer 220 is between 1 and 10 nm, in some examples between 3 and 5 nm. For a floating gate device, the thickness values could be very different. The second layer 220, if intended to form a floating gate, can be made of any suitable conductive material, such as for instance a metal or a doped polycrystalline silicon gate. It can also be a hybrid floating gate (metal combined with poly). The second layer 220, if intended to form a charge trapping layer, can for instance be a nitride layer. In the example the second layer 220 has a thickness of 2 nm and is made of $Si_3N_4$ or metal. On top of the second layer 220, a control dielectric 250 is provided, for instance a $HfO_2$ layer as top dielectric because $HfO_2$ is compatible with CMOS. Instead of $HfO_2$ any other insulator of sufficient quality may be used. Such an insulator can have a higher k value, for example about 10 to 100. On top of the control dielectric 250, a conductive gate 260, for instance a metal gate or poly gate, is provided.

Figure 12:
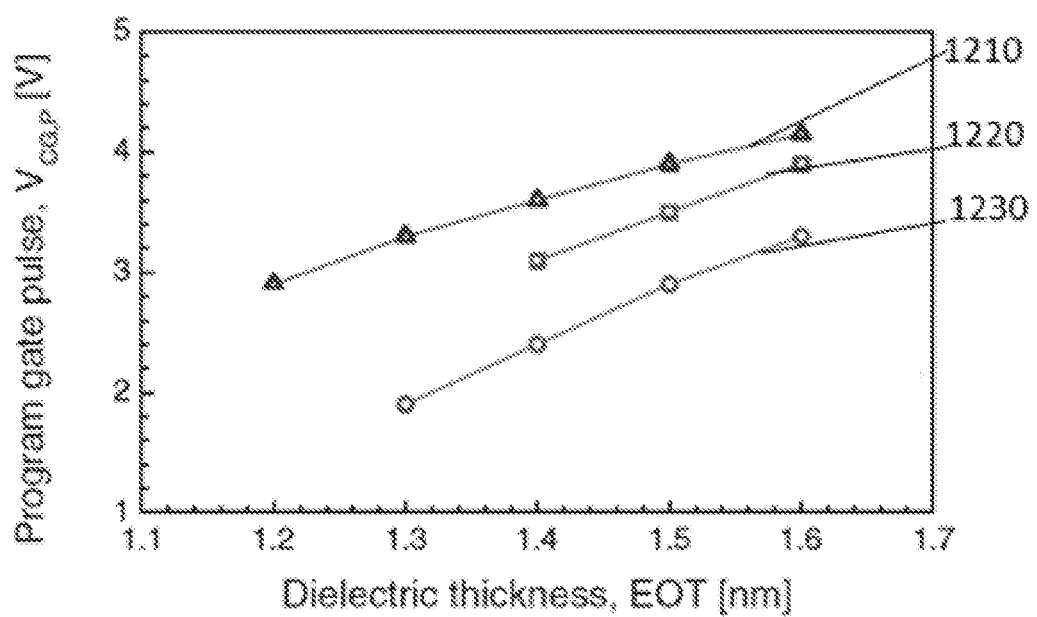
FIG. 12 shows the program gate pulse voltage in function of the dielectric thickness for direct tunneling transistors as may be used in embodiments of the present disclosure.

Because of the limited thickness of the tunnel dielectric layer 210, the retention period is short. The program gate pulse voltage (in V) in function of the dielectric thickness (in nm) for direct tunneling transistors is illustrated in FIG. 12. The programming pulses had a duration of 10 ns. The top curve 1210 in the graph corresponds with a tunneling device wherein the tunnel oxide is made of HfSiON (23% Hf). When the tunnel dielectric layer has a thickness of 1.2 nm, a refresh period of 64 ms is required, while for a thickness of 1.3 nm, a refresh period of 100 s would be sufficient. Therefore regular refresh is required when using direct tunneling transistors in memory cells according to the present disclosure. The trade-off here is that by increasing the thickness, also the programming voltage increases. The middle curve 1220 in the graph corresponds with a tunneling device wherein the tunnel dielectric layer is made of $SiO_2$. The bottom curve 1230 in the graph corresponds with a tunneling device wherein the tunnel oxide is made of SiON. For this material the refresh period of 200 μs is required at 1.3 nm thickness, while a refresh period of 64 ms suffices at 1.4 nm thickness.

The write voltage for non-volatile memories based on FeFETs, on the other hand, is not as high as the write voltage for writing memories based on direct tunneling transistors.

Figure 3:
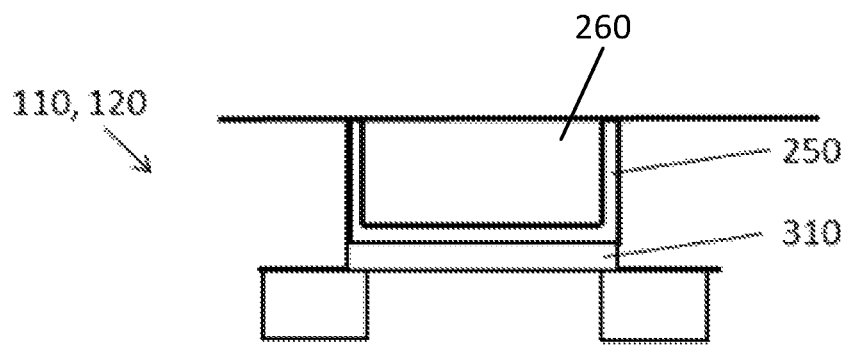
FIG. 3 shows the gate stack of a ferroelectric transistor as may be used in embodiments of the present disclosure.

FIG. 3 shows a gate stack of a transistor 110, 120 (FeFET version) which may be used in a memory cell 100 in accordance with embodiments of the present disclosure. The stack comprises a first layer 310 which is a ferroelectricum. The ferroelectricum may for instance be a doped $HfO_2$. The dopant may be, for example, aluminum or yttrium or strontium. In embodiments of the present disclosure, the ferroelectricum is an Al doped $HfO_2$ layer, which is activated after dummy gate and junction implants. In embodiments of the present disclosure, the thickness of the first layer is between 3 and 10 nm, and in some examples between 3 and 5 nm. In a particular example, the first layer is about 5 nm. On top of the first layer 310, a control dielectric 250 may be provided. In contrast to direct tunneling cells, the control dielectric is not essential for FeFETs. However, the presence of the control dielectric 250 may increase the compatibility, e.g. when the top dielectric is a CMOS gate. An $HfO_2$ layer 250 may be particularly suitable because of its compatibility with CMOS. On top of the $HfO_2$ layer 250, a gate 260 is provided, for instance a metal gate. Whereas in alternative FeFETs for non-volatile memory, there is a need to remove the depolarization field, this is not the case for the FeFET transistors in memories according to embodiments of the present disclosure, as in this case no long term retention of data in the FeFET transistors is required.

Figure 4:
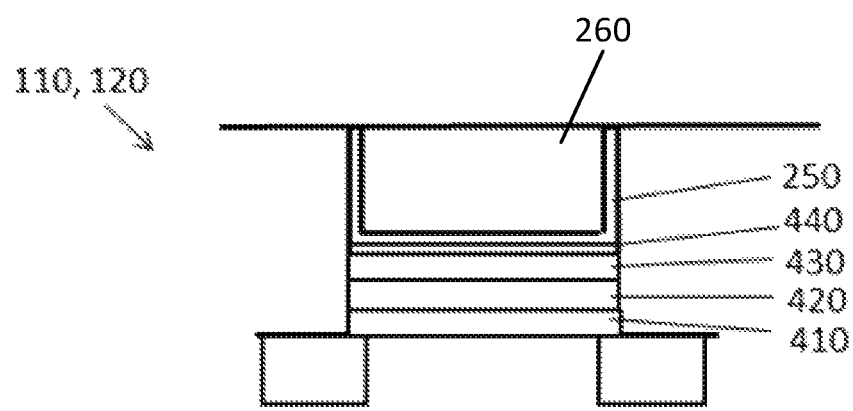
FIG. 4 shows the gate stack of a charge trapping transistor as may be used in embodiments of the present disclosure.

FIG. 4 shows a gate stack of an alternative transistor 110, 120 which may be used in a memory cell 100 in accordance with embodiments of the present disclosure. The stack comprises a first dielectric layer 410 (for example an oxide layer, e.g. a $SiO_2$ layer with a thickness of about 2 nm or below) for use as a tunnel dielectric layer, a second layer 420 which is a charge trapping layer (for instance a nitride layer e.g. a $Si_3N_4$ layer with a thickness of about 5 nm), and a third layer 430 which is a dielectric layer (for instance an oxide layer, e.g. $SiO_2$ with a thickness of about 5 nm). On top of the third layer 430 a thin etch stop layer 440 (such as for instance $Al_2O_3$) is present. On top thereof is a high-k material 250 (e.g. $HfO_2$) and a gate 260, e.g. a metal gate. The high-k material 250, e.g. $HfO_2$, and the gate 260, e.g. metal gate, can be applied together with the CMOS process. In some embodiments of the present disclosure, this can be done with no or with at most 1 additional mask. The latter occurs if the gate etch has to be done separately. Additional masks may for example be required for high voltage transistors but not because of the chosen flash concept. A replacement gate process flow may be used.

The gate voltage required to write a transistor, part of a memory cell 100 according to embodiments of the present disclosure, may be between 2 and 4 V, for example about 3 V. The smaller the thickness of the tunnel dielectric layer 210, 310, 410, the smaller the required gate voltage for programming the memory cell 100. The required gate voltage may be decreased by using a charge trapping layer 220, 420 (in a charge trapping transistor), e.g. a nitride layer, or by using FeFET technology which does not have to cope with the trade-off between performance (voltage needed for erase and write) and retention. FeFET has moreover a simpler process technology and a better non-volatility than direct tunneling.

Figure 5:
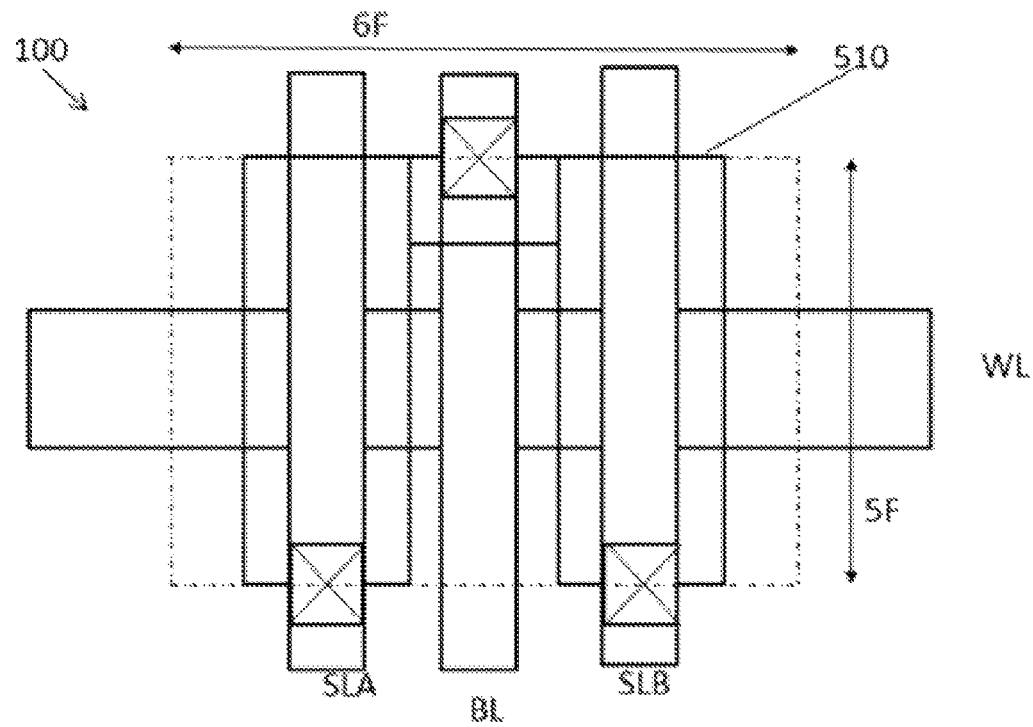
FIG. 5 shows a basic layout of a memory cell in accordance with embodiments of the present disclosure.

FIG. 5 shows a basic layout (top view) of a memory cell 100 in accordance with embodiments of the present disclosure. The layout is very basic as not all layers are drawn. For example the well is, although required, not drawn. The source lines SLA and SLB are drawn, the bit line BL is drawn, the word line WL is drawn and the active area 510 is drawn. The goal of this layout is to get an estimate of the size of a cell 100 in accordance with embodiments of the present disclosure. In reality, the cell size may be bigger because of the well and the required spacing rule. The area of the cell in this example is 6 F×5 F wherein F is the feature size. For the calculation the following formula was used:

(3ML1 layers=6 F)×(1CNT+1 gate+2CNT spacing+ 1AA spacing=5 F)=30 $F^2$

This is a first order calculation wherein ML1 layers are the metal layers #1, wherein CNT stands for contact side, and wherein AA is the active area.

For writing a memory cell 100 according to embodiments of the present disclosure, a same positive voltage can be applied to the gates of the first transistor 110 and second transistor 120. The following paragraphs apply to a direct tunneling transistor, although the present disclosure is not limited thereto. When a positive voltage is applied to the gate of an n-channel, the n-channel will go into inversion and when a positive voltage is applied to the gate of a p-channel, the p-channel will go into accumulation. When applying a positive voltage to both gates, this results in a threshold voltage Vt which increases for the n-channel transistor as well as for the p-channel transistor. By increasing the threshold voltage Vt of the n-channel transistor, the n-channel switches off; and by increasing the threshold voltage Vt of the p-channel transistor, the p-channel switches on. Moreover, in some embodiments of the present disclosure, write is self-limiting (i.e. the nMOS floating gate voltage stops at the threshold voltage Vt, the pMOS floating gate voltage stops at the flat band voltage Vfb).

The gates of the first and second transistors 110, 120 may be driven together by one and the same word line, or they may be driven separately. When driving a plurality of cells of which the gates are connected with the same word line, the cells that need to be '1' can be written by applying a high voltage on the word line, while inhibiting the other bit lines. The use of a single word line for driving both gates simultaneously yields a very compact design of two cells with only four terminals.

Before writing, first all memory cells according to embodiments of the present disclosure need to be erased. Therefore, in embodiments of the present disclosure, two cycles are contemplated: one for erasing, and one for writing.

Erasing can be done by applying the same negative gate voltage to the gate of the first transistor 110 as to the gate of the second transistor 120. For erasing, an n-channel erase in accumulation can be combined with a p-channel erase in inversion. Moreover, in some embodiments of the present disclosure, erasing is self-limiting (i.e. the nMOS floating gate voltage stops at the flat band voltage Vfb, the pMOS voltage stops at the threshold voltage Vt).

Alternatively, a positive bias at the wells may be used for erasing. This has the advantage that no negative voltages are required. However, it requires a large capacitor to be charged.

In the case of a ferroelectric transistor, the following rules apply: a FeFET gets a high threshold voltage Vt with negative bias, and a low threshold voltage Vt with positive bias. Hence, the program/erase definitions are reversed as compared to tunneling cells. The natural window (typical window associated with a given design because of the self-limiting program/erase operation) should be calculated to differentiate between the three cases (floating gate, charge trap device, FeFET). Typically in floating gate transistors and charge trap devices, retention is traded for lower voltage and good endurance.

When writing a memory cell 100 according to embodiments of the present disclosure, the gate voltage must be high enough in order to obtain the tunneling effect or to obtain the ferroelectric polarization (depending on the type of transistors used). A typical write voltage at the gate of a direct tunneling transistor is twice the supply voltage or higher. At lower voltages this leads to a smaller window. In general, the retention gets better for a smaller Vt window.

However at too small voltages the signal, to be detected by the differential sense amplifier, will be too small because the Vt window will be too small. The Vt window or memory window is the difference between high Vt and low Vt, and the actual signal for the sense amplifier is the current difference generated by this Vt shift. An option would be to reduce the thickness of the tunnel dielectric. However, for voltages below 2 Vcc, it would be required to make the tunnel dielectric so thin that the retention is so small that the charge immediately disappears (e.g. after less than a few seconds, such as after 1 second or less).

The voltage for writing may be higher than 2 Vcc. However, this is at the cost of an increased area and an increased power consumption. The supply voltage can be increased on chip using a boot strap circuit. The boot strap circuit is a capacitive circuit for increasing the supply voltage. The disadvantage of the circuit is that it occupies cell area. By limiting to a write voltage which is the double of the supply voltage this boot strap circuit can be realized with only one capacitor.

In accordance with embodiments of the present disclosure, the read voltage, applied to the gate, is located between zero and the write voltage. The optimal read voltage depends on the design and is a trade-off between getting a high on-current and preventing writing the memory cell while reading the memory cell. If the read voltage is too high, the memory cell will be written when reading it. If it is too low, the read current will be too low to detect. When reading, a voltage is applied to the bit line. This voltage is selected so as to not cause a disturb problem. For example Vcc, may be applied to the bit line. A typical read voltage at the gate is the supply voltage itself or half of the supply voltage.

When a memory cell according to the present disclosure is not addressed within a period of time, it needs to be re-written (e.g. like in DRAM). State of the art refresh techniques can be used for refreshing memory cells according to embodiments of the present disclosure.

Embodiments of the present disclosure are operate in a complementary mode like in SRAM and need to be refreshed like in DRAM. The density of cells according to embodiments of the present disclosure is between the density of SRAM and the density of DRAM.

Figures 8, 9:
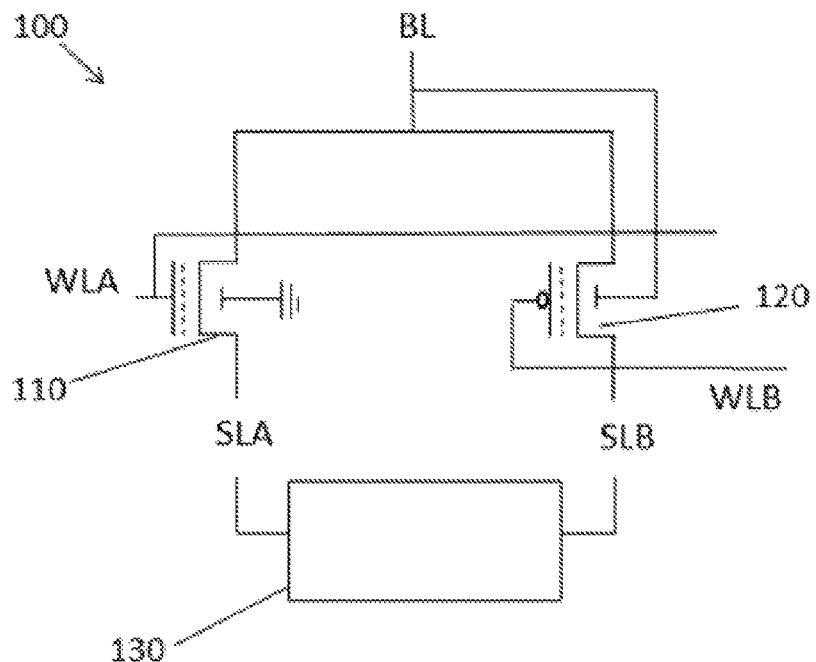
FIG. 8 shows a circuit diagram of a 2 T memory cell with separately controllable gates in accordance with embodiments of the present disclosure.
FIG. 9 shows an operating table for operating a 2 T-memory cell as in FIG. 1, in accordance with embodiments of the present disclosure.

FIG. 9 shows an operating table for operating a memory cell 100 in accordance with embodiments of the present disclosure. The operating table of FIG. 9 is for example suitable for operating the memory cell illustrated in FIG. 1. Before writing, an erase step is done.

For erasing the memory cell, −2 Vcc is applied to the word line WL while keeping the bit line BL, source line A (SLA) and source line B (SLB) at 0 volts.

For writing the memory cell 100, the word line WL is set at 2 Vcc while SLA and SLB are left open. Selecting the cell can be done by applying a zero voltage to the bit line BL. Deselecting the cell can be done by applying a voltage between Vcc and 2 Vcc to the bitline BL. This voltage at the bitline reduces the difference between WL and BL and thus also the gate-to-drain voltage Vgd. Since the source is open, this voltage Vgd is over the entire channel length and inhibits programming. As a voltage of 2 Vcc needs to be applied to the word line, a boot strap circuit is needed in the word line decoder. The boot strap circuit should be able to generate 2 Vcc from Vcc.

For reading the cell 100, Vcc/2 is applied to the word line WL and Vcc is applied to the bitline BL. The current difference is measured using the sense amplifier 130.

The margin between the threshold voltage Vt and the gate voltage when reading determines the current which can be emitted. The threshold window is the difference between high Vt and low Vt.

The same operating table can be used for erasing/programming/reading a 2 T-memory cell based on floating gate/charge trapping transistors as for erasing/programming/reading 2 T-memory cells based on ferroelectric FETs.

Figure 6:
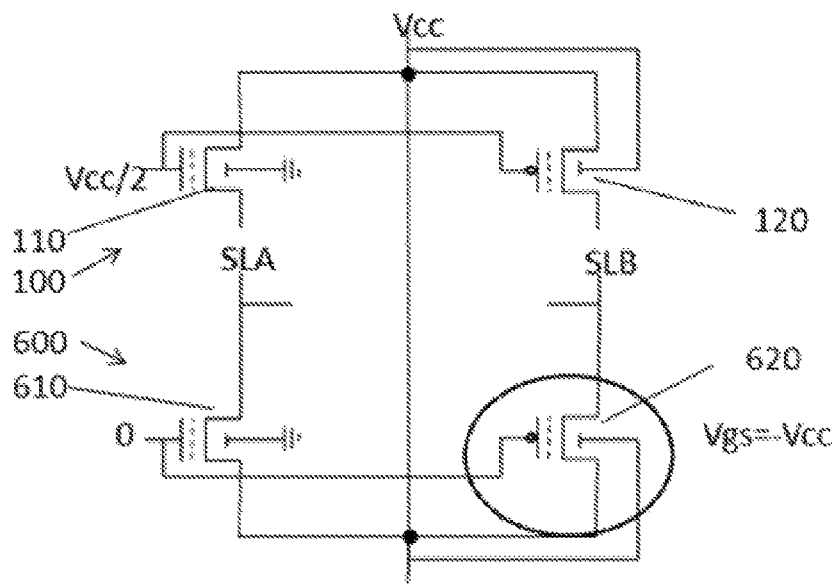
FIG. 6 shows two memory cells according to embodiments of the present disclosure which are arranged in a matrix.

FIG. 6 shows two memory cells 100, 600 according to embodiments of the present disclosure organized in a matrix. The memory cells in the matrix are logically organized in rows and columns. Throughout this description, the terms "horizontal" and "vertical" (related to the terms "row" and "column" respectively) are used to provide a co-ordinate system and for ease of explanation only. They do not need to, but may, refer to an actual physical direction of the device. Furthermore, the terms "column" and "row" are used to describe sets of array elements (in the form of memory cells) which are linked together. The linking can be in the form of a Cartesian array of rows and columns; however, the present disclosure is not limited thereto. As will be understood by those skilled in the art, columns and rows can be easily interchanged and it is intended in this disclosure that these terms be interchangeable. Also, non-Cartesian arrays may be constructed and are included within the scope of the disclosure. Accordingly the terms "row" and "column" should be interpreted widely. To facilitate in this wide interpretation, the present disclosure refers to memory cells "logically organized in rows and columns". By this is meant that sets of memory cells are linked together in a topologically linear intersecting manner; however, that the physical or topographical arrangement need not be so. For example, the rows may be circles and the columns radii of these circles and the circles and radii are described in this disclosure as "logically organized" rows and columns. Specific names of the various lines, e.g. word line and bit line, are intended to be generic names used to facilitate the explanation and to refer to a particular function and this specific choice of words is not intended to in any way limit the disclosure. It should be understood that all these terms are used only to facilitate a better understanding of the specific structure being described, and are in no way intended to limit the disclosure.

The array illustrated in FIG. 6 only comprises two memory cells 100, 600 for ease of explanation, but a memory array may include many more memory cells. The memory array illustrated in FIG. 6 comprises two memory cells arranged vertically one atop the other; hence the memory cell has two rows and one column. The first memory cell 100 comprises an n-channel transistor 110 and a p-channel transistor 120. The second memory cell 600 comprises an n-channel transistor 610 and a p-channel transistor 620.

Source lines A of both cells 100, 600 are connected together in point SLA and source lines B of both cells 100, 600 are connected together in point SLB. A bit line runs vertically along the column direction of the memory array and is connected to the first main electrodes of both memory cells and to the bulk of the p-channel transistors 120, 620 of both cells. Word lines run horizontally along the row direction of the memory array and is connected to the gates of the memory cells on a row (they are not connected with the bit line).

When selecting a particular cell for reading or writing, a voltage is put both on the word line and on the bit line of the array which cross at the location of that particular cell. If a voltage is applied on one bit line, the voltage is applied to all cells connected to this bit line, and if a voltage is applied to one word line, the voltage is applied to all cells connected to that word line.

A disturb problem occurs when reading a memory cell, for instance the first memory cell 100. In that case a voltage Vcc/2 is applied to the word line associated with the row on which the memory cell to be read is located, for instance the word line associated with the first memory cell 100, while the word lines of the other rows, e.g. in the embodiment illustrated in FIG. 6 the word line associated with the second memory cell 600 is set to zero volts. A voltage Vcc is applied to the bit line associated with the column on which the memory cell to be read is located, for instance the bit line associated with the first memory cell 100, while the bit lines of the other columns (none in the embodiment illustrated in FIG. 6) are set to zero Volt. The disturb problem occurs on transistor 620 of the second memory cell 600. The Vgs voltage of this transistor is −Vcc, and the (written) p-channel transistors on the same bit line will draw more current in read than the addressed cell. If the cell 100 is read and the word line of the cell 600 is at zero Volt, the p-channel transistor 620 will be on. Therefore a current will be flowing through this transistor 620. This current will flow on the same source line as the source line of the cell which is being read. As the sense amplifier, receiving this signal on the source line, cannot distinguish from which cell the current is coming, this can result in a wrong reading.

In embodiments of the present disclosure, this is solved by providing a separate word line for the n-channel transistor and a separate word line for the p-channel transistor. An example of such a cell is illustrated in FIG. 8. This allows some embodiments to inhibit the n- and p-transistors on the same BL with different voltages (−Vcc for NMOS, +Vcc for pMOS). FIG. 11 shows an operating table for operating a 2 T-memory cell with a separate word line for the n-transistor and a separate word line for the p-transistor in accordance with embodiments of the present disclosure.

In embodiments of the present disclosure the read disturb problem may be solved by applying a negative voltage to the word line of the second cell 600 while reading the first cell 100. The advantage thereof may be that neither a third transistor nor separate word lines for the n-channel and p-channel transistors are required. The disadvantage may be, however, that a negative voltage is required which increases the periphery. All the word lines which are not addressed should be set to a negative voltage which increases the overhead. Nevertheless, the negative erase voltage is already present in the decoder, so this voltage could also be used for reading.

Figure 7:
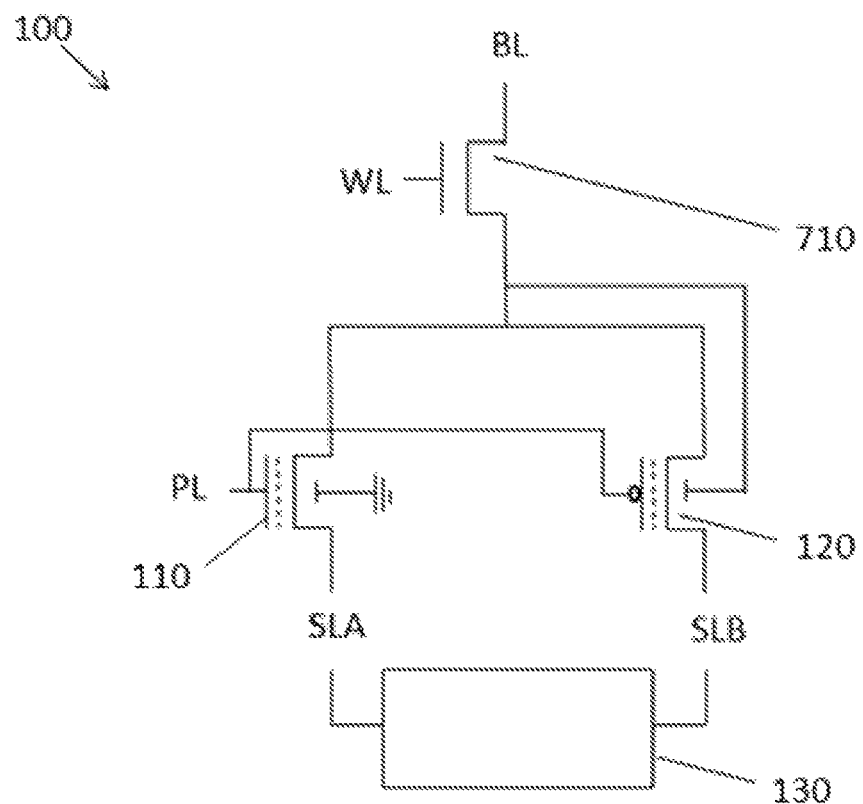
FIG. 7 shows a circuit diagram of a 3 T memory cell in accordance with embodiments of the present disclosure.

Some problems that can be present may include the read disturb problem discussed above, as well as the problem of the dual-cell configuration, which is not over-erase insensitive, that is illustrated in FIG. 8. In an effort to overcome these problems, in some embodiments of the present disclosure a select transistor 710 may be added between the bit line and the memory cell, such as in FIG. 7. Hence a 3 T memory cell is obtained. The select transistor may be an n-MOS transistor. A word line is then coupled to the gates of the select transistors of cells logically arranged on the same row. In these embodiments the cell can be read with 0V at the gates of the n-channel and p-channel transistors 110, 120 (swing=1+Vcc). FIG. 10 shows an operating table for operating a 3 T-memory cell (the cell of FIG. 7) in accordance with embodiments of the present disclosure. In these embodiments, the cell is addressed through the gate of the select transistor to which the word line (WL) is connected. Programming the cell is done by applying a voltage to the programming line (PL) connected to the gates of the first transistor 110 and the second transistor 120.

In embodiments of the present disclosure, the read disturb problem is solved by keeping the window positive: no negative voltage needed. To deselect cells on the same BL the currents through these cells need to be cut off. If the window is symmetrical, this implies a negative gate bias. If the window is positive (low and high Vt above zero) the cell can be deselected with a zero voltage. This requires less periphery, but the needed gate voltage will be higher for writing. The window may for example between 0.5 V and 2.5 V instead of between −1 V and +1 V.

Memory cells according to the present disclosure may be applied as cache memory. In some embodiments, they may be applied at L1 and higher levels. At register level and at L0 level the cell area is not so critical but the speed of the processor should be matched. This can be done by state of the art SRAM.

At higher levels (L1 and higher), however, such a high speed is not required on a bit level. At the higher cache levels the bandwidth is important. These SRAMs could hence be replaced by memory cells according to embodiments of the present disclosure. In some embodiments of the present disclosure, by replacing these SRAM cells with memory cells according to embodiments of the present disclosure the total area can be decreased (by going from 6 T to 3 T or even to 2 T per cell). In the 2 T case this may lead to an area reduction with a factor 4 or even with a factor 5 (30 $F^2$ compared to 150 $F^2$).

Memory cells according to embodiments of the present disclosure may also replace (e-)DRAM Memory cells according to embodiments of the present disclosure may be employed as FPGA cells.

The invention claimed is:

1. A memory cell comprising:
a first transistor, wherein the first transistor is a Vt-modifiable n-channel transistor having a control electrode, a first main electrode, and a second main electrode;
a second transistor, wherein the second transistor is a Vt-modifiable p-channel transistor having a control electrode, a first main electrode, and a second main electrode; and
a differential sense amplifier,
wherein the control electrodes of the first and second transistors are connected together, wherein the first main electrodes of the first and second transistors are connected together, wherein the differential sense amplifier is connected to the second main electrodes of the first and the second transistors, and wherein the differential sense amplifier is adapted for sensing a current difference between the first transistor and the second transistor.

2. A memory cell according to claim 1, wherein the first transistor and the second transistor are direct tunneling devices.

3. A memory cell according to claim 2 wherein the first transistor and the second transistor are floating gate transistors.

4. A memory cell according to claim 3, wherein a gate stack of the first transistor and the second transistor comprises a first oxide layer, a second metal or doped polycrystalline layer, an $HfO_2$ layer, and a metal gate.

5. A memory cell according to claim 2, wherein the first transistor and the second transistor are charge trap devices.

6. A memory cell according to claim 5, wherein a gate stack of the first transistor and the second transistor comprises a first oxide layer, an $HfO_2$ layer, and a metal gate.

7. A memory cell according to claim 6, wherein the gate stack further comprises a nitride layer.

8. A memory cell according to claim 1, wherein the first transistor and the second transistor are ferroelectric field effect transistors.

9. A memory cell according to claim 8, wherein a gate stack of the first transistor and the second transistor comprises a first ferroelectric layer made of doped $HfO_2$, a second $HfO_2$ layer, and a metal gate.

10. A memory cell according to claim 1, wherein the memory cell further comprises a third transistor, and wherein a first main electrode of the third transistor is connected to the first main electrodes of the first and second transistor.

11. A memory array used as cache memory, the memory array comprising two or more memory cells, wherein each memory cell comprises:
a first transistor, wherein the first transistor is a Vt-modifiable n-channel transistor comprising a control electrode, a first main electrode, and a second main electrode;
a second transistor, wherein the second transistor is a Vt-modifiable p-channel transistor comprising a control electrode, a first main electrode, and a second main electrode; and
a differential sense amplifier,
wherein the control electrodes of the first and second transistors are connected together, wherein the first main electrodes of the first and second transistors are connected together, wherein the differential sense amplifier is connected to the second main electrodes of the first and the second transistors, and wherein the differential sense amplifier is adapted for sensing a current difference between the first transistor and the second transistor.

12. A memory array according to claim 11, wherein the first transistor and the second transistor of each memory cell are direct tunneling devices.

13. A memory array according to claim 12 wherein the first transistor and the second transistor of each memory cell are floating gate transistors.

14. A memory array according to claim 12, wherein the first transistor and the second transistor of each memory cell are charge trap devices.

15. A memory array according to claim 11, wherein the first transistor and the second transistor of each memory cell are ferroelectric field effect transistors.

16. A memory array according to claim 11, wherein each memory cell further comprises a third transistor, and wherein a first main electrode of the third transistor is connected to the first main electrodes of the first and second transistor.

17. A method for writing a memory cell, the memory cell comprising a first transistor, a second transistor, and a differential sense amplifier, wherein the first transistor is a Vt-modifiable n-channel transistor comprising a first and a second main electrode and the second transistor is a Vt-modifiable p-channel transistor comprising a first and a second main electrode, the first main electrodes of the first and second transistors being connected together, and the differential sense amplifier being connected to the second main electrodes of the first and the second transistor, wherein the differential sense amplifier is adapted for sensing a current difference between the first transistor and the second transistor, the method comprising:
- erasing the memory cell by applying a same erase voltage to a control electrode of the first transistor as to a control electrode of the second transistor; and
- writing the memory cell by applying a same write voltage to the control electrode of the first transistor as to the control electrode of the second transistor.

18. A method according to claim 17, wherein the write voltage is less than or equal to twice a supply voltage.

19. A memory cell according to claim 10, wherein the third transistor connects the first main electrodes of the first and second transistors to a bit line of the memory cell.

20. A memory array according to claim 16, wherein the third transistor connects the first main electrodes of the first and second transistors to a bit line of the memory cell.

* * * * *